United States Patent [19]

Holmberg

[11] Patent Number: 4,531,144
[45] Date of Patent: Jul. 23, 1985

[54] ALUMINUM-REFRACTORY METAL INTERCONNECT WITH ANODIZED PERIPHERY

[75] Inventor: Scott H. Holmberg, Escondido, Calif.

[73] Assignee: Burroughs Corporation, Detroit, Mich.

[21] Appl. No.: 580,291

[22] Filed: Feb. 21, 1984

Related U.S. Application Data

[63] Continuation of Ser. No. 378,124, May 14, 1982, abandoned, which is a continuation of Ser. No. 106,074, Dec. 20, 1979, abandoned, which is a continuation of Ser. No. 919,277, Jun. 28, 1978, abandoned.

[51] Int. Cl.³ .................... H01H 23/48; H01H 29/46
[52] U.S. Cl. ...................................... 357/71; 357/67; 357/65
[58] Field of Search ................... 357/71 S, 71, 2, 65, 357/67

[56] References Cited

U.S. PATENT DOCUMENTS

| 3,654,526 | 4/1972 | Cunningham et al. | 357/67 X |
| 3,939,047 | 2/1976 | Tsunemitsu et al. | 357/71 S |
| 4,001,871 | 1/1977 | Tsunemitsu | 357/73 X |

Primary Examiner—Andrew J. James
Assistant Examiner—John Lamont
Attorney, Agent, or Firm—Charles J. Fassbender; Mervyn L. Young; Kevin R. Peterson

[57] ABSTRACT

A metal interconnect structure for an integrated circuit with a layer of refractory metal over the structure to prevent formation of hillocks, thereby eliminating a hard anodization step. The refractory metal may be tantalum, titanium-tungsten alloys, hafnium, or other refractory metals which form insulating anodic oxides.

7 Claims, 4 Drawing Figures

ALUMINUM-REFRACTORY METAL INTERCONNECT WITH ANODIZED PERIPHERY

This is a continuation of application Ser. No. 378,124, filed May 14, 1982; which was a continuation of Ser. No. 106,074, filed Dec. 20, 1979; which was a continuation of Ser. No. 919,277, filed June 28, 1978, all now abandoned.

BACKGROUND OF THE INVENTION

1. Field of the Invention

This invention relates to a metal interconnect system for integrated circuits and more particularly to such a system for circuits employing amorphous semiconductor devices.

2. Description of the Prior Art

In the formation of integrated circuit chips the electrical interconnections between the various elements on the wafer can be formed by depositing aluminum over the respective chips then anodizing the aluminum in a particular pattern so as to form the respective conductor circuits between the elements. In the anodization process, a barrier layer of aluminum oxide is formed over the aluminum and a photoresist pattern is then formed over the barrier layer utilizing standard photolithography techniques. The barrier layer prevents the formation of hillocks in the aluminum during later processing. The barrier layer is then etched away in the areas where there is no photoresist pattern, and those portions of the aluminum layer thus exposed are then subsequently anodized to form insulating areas that define conductive circuit patterns.

Memory cells for electrically alterable read-only memories may be formed on top of the integrated circuit structure, which cells are formed of amorphous semiconductor material which are capable of being switched to and from a low-resistance crystalline state. A particular type of memory switching amorphous semiconductor material is the tellurium base chalcogenide class of material. Such an amorphous memory device is described, for example, in the Holmberg patent application, Ser. No. 847,068, filed Oct. 31, 1977.

A particular problem in making electrical contact with such a amorphous material is that it will interdiffuse with the aluminum conductive material during the fabrication, or during the electrical write operation after the device has been fabricated. Thus, in the prior art fabrication of such devices, a refractory material must first be placed over the conductor at those positions where contact is to be made. This requires additional lithographic and other processing steps which increase the time and cost of fabrication.

In addition, prior art processes of aluminum anodization have a number of drawbacks as a technique for patterning the metal interconnection in any integrated circuit chip. For example, anodization of the aluminum is not consistant from one wafer to another. Furthermore, floating metal patterns and metal connectors to base diffusion areas of the chip often result in base to base electrical shorts after the anodization process. This is a particular problem in bipolar memory products where there are many such base diffusion connections. In addition, the leakage and forward voltage drop of aluminum Schottky diodes vary from device to device, which diodes are formed by the aluminum contact with the silicon substrate. Palladium and platinum silicide Schottky diodes are generally well behaved and more consistent but cannot be used under aluminum connectors without a barrier metal therebetween.

It is then an object of the present invention to provide an improved conductor structure.

It is another object of the present invention to provide an improved electrical conductor for employment with integrated circuit chips.

It is still a further object of the present invention to provide an improved conductor that can make electrical contact with amorphous semiconductor materials.

SUMMARY OF THE INVENTION

In order to accomplish the above described objects, the present invention is directed toward an electrical interconnect structure for employment with integrated circuit devices, which structure does not require a hard anodization step over the entire conductor surface to prevent the formation of hillocks and the like in a multilevel metal conductor structure. In addition, the present invention is directed toward an electrical conductor structure for employment with amorphous semiconductor devices where there will be no barrier layers between the amorphous semiconductor material and the conductor material. It has been found that refractory metals such as tantalum, titanium-tungsten alloys or hafaium can be employed to replace the anodized layer.

A feature then of the present invention resides in an electrical interconnect structure for employment with integrated circuit devices which structure employs a metal layer such as aluminum over an insulating layer and a layer of refractory metal over the conductive metal layer. The rest of the multilevel conductive structure can be formed thereon.

Another feature of the present invention resides in such a multilayer conductive structure where the conductive metal layer is provided with a layer of such a refractory metal on both its upper and lower surfaces.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
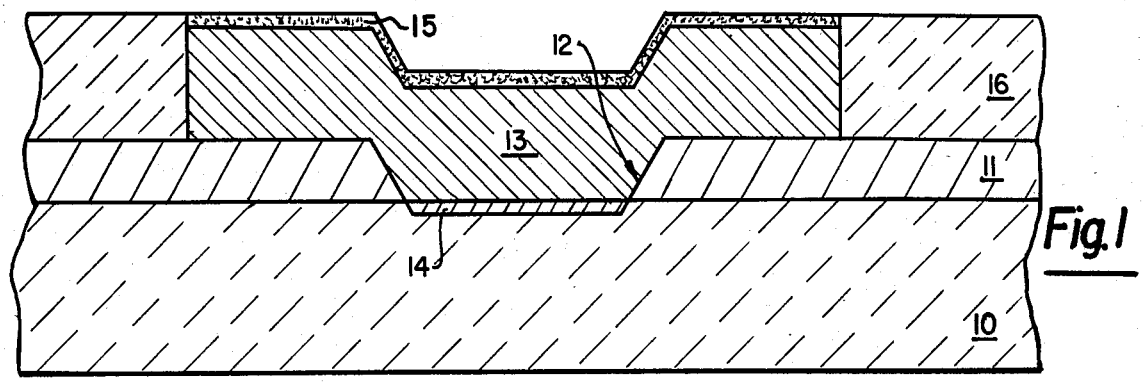
FIG. 1 is a cross-sectional view of an electrical contact as employed in the prior art.

In order to illustrate the differences between the present invention and the prior art, a typical prior art embodiment will now be described in relation to FIG. 1. As shown therein, an insulative layer 11 which may be silicon dioxide is formed on the surface of semiconductor substrate 10 and via 12 is opened in layer 11 for subsequent electrical contact with substrate 10. Substrate 10 may have various active devices formed therein. Aluminum interconnect layer 13 is then deposited over insulative layer 11 and via 12 where it forms an aluminum-silicon alloyed Schottky diode 14 with the silicon substrate 10. This could also be an ohmic contact to other silicon regions on the wafer depending doping concentrations in the silicon under via 12. The entire conductive layer 13 is then subjected to a hard anodization to form a dense aluminum oxide layer 15 of approximately 1,000 angstroms in thickness. Prior to this hard anodization, aluminum layer 13 may be subjected to a soft anodization to form a thin porous oxide layer for resist adhesion (not shown). Hard barrier layer 15 is provided in order to prevent the formation of hillocks that can cause short circuits with other connectors placed over aluminum connector 13. A photoresist pattern is then formed over areas of the wafer wherever a metal pattern is desired. Hard barrier layer 15 is then etched away in the areas where there is no photoresist pattern. The exposed portions of aluminum layer 13 are then provided with a soft anodization to create porous aluminum oxide regions 16 where the aluminum interconnect is not desired. After the photoresist layer is removed, the structure thus formed is then ready for the deposition of a second dielectric layer and so forth. In addition to the suppression of hillocks during subsequent high temperature processes, or high current densities, hard annodic oxide layer 15 further serves to prevent anodization of the aluminum conductors thereunder.

As is indicated above, a problem is encountered when the device is being fabricated to employ amorphous semiconductor materials such as might be employed in eraseable read-only memories. Cells formed of such materials require electrical contacts with both the bottom and upper surfaces. Therefore, in the fabrication of a memory array of such cells, the cells are normally formed on top of a silicon substrate which has first been supplied with the conductive leads. The problem encountered is that such amorphous semiconductor materials interdiffuse with the metal and thus degrade device performance. Therefore, it is necessary to place a refractory metal between the amorphous cell and the underlaying as well as the overlaying aluminum connectors. It has been discovered that tantalum is particularly applicable for such a purpose. With the use of such a refractory metal on the top of the aluminum connector, it is not necessary to provide the hard anodization barrier layer as the tantalum serves to suppress hillock formation whenever the wafer and corresponding circuitry is subjected to high temperatures or the aluminum metal is subjected to high current densities. Furthermore, the tantalum layer can be anodized to form an oxide which in turn serves as an electrical insulation where desired. Other refractory metals and alloys which form electrically insulating oxides are hafnium and titanium-tungsten alloys.

The employment of these particular refractory metals and alloys serve to eliminate two anodization steps in the formation of the metal interconnect structure on an integrated circuit chip thereby reducing the time and cost in the manufacturing of such circuits.

Figure 2:
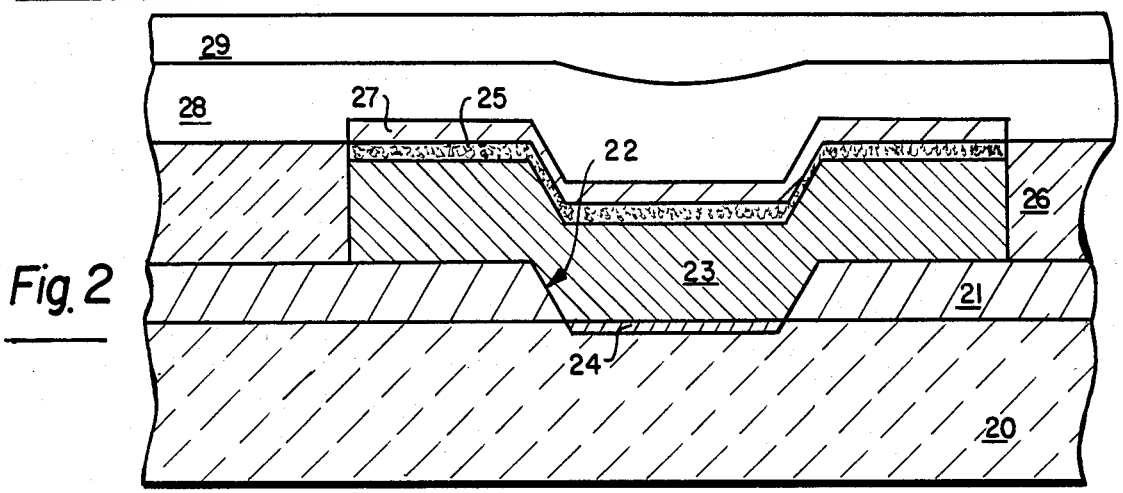
FIGS. 2–4 are cross-sectional views of various embodiments of the present invention.

One embodiment of the present invention is illustrated in FIG. 2. After silicon dioxide layer 21 has been deposited on silicon substrate 20, via 22 is opened and the substrate is heated to approximately 420° C. and aluminum layer 23 is deposited to form an aluminum-silicon alloy layer 24 with the silicon substrate. Aluminum layer 23 is approximately one micrometer thick. Tantalum layer 25 is then deposited over the aluminum to a thickness of approximately 1000 Å. Silicon dioxide layer 27 is then deposited over tantalum layer 25. A photoresist pattern is then formed over the silicon dioxide wherever the metal conductors are desired and the wafer is then subjected to a carbon tetrafluoride plasma with approximately four percent oxygen to remove the silicon dioxide and tantalum from areas wherever soft anodization is being carried out, thereby exposing portions of aluminum layer 23. The exposed aluminum surface is then anodized in a phosphoric or sulfuric solution to convert that exposed aluminum to aluminum oxide layer 26 down to the surface of silicon dioxide layer 21. The photoresist material is then removed and the wafer is then ready for the deposition of a second dielectric layer 28 to receive another conductor 29 and so forth.

Figure 3:
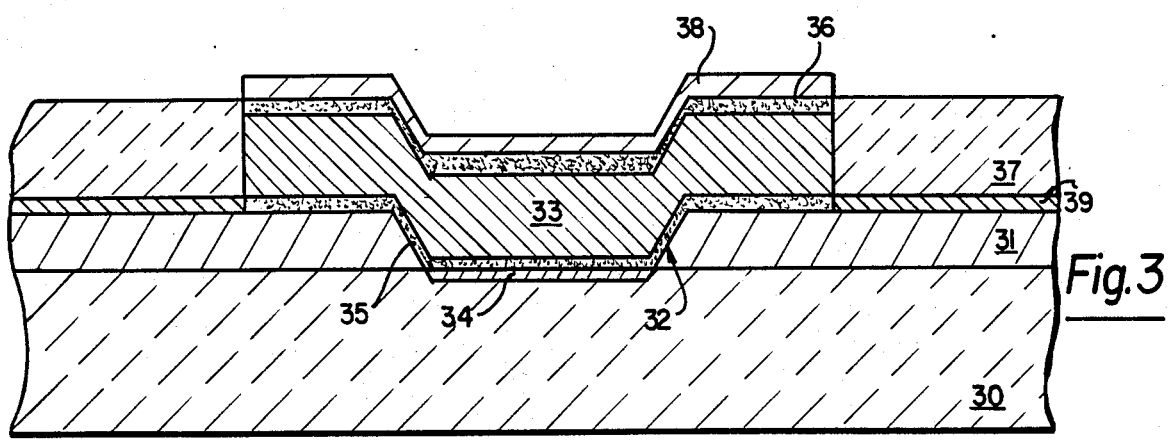

As is indicated above, refractory metals have been employed in the prior art under the aluminum conductor and both the refractory metal and the aluminum conductor are then independently anodized to form the conductive pattern. However, the prior art still employed a hard anodic aluminum oxide aluminum oxide layer on top of the conductor. The use of a refractory metal under the conductor can be incorporated with the features of the present invention to create a structure illustrated in FIG. 3. In this embodiment, via 32 is opened in silicon dioxide layer 31 on the surface of substrate 30. Palladium or platinum is then deposited over the entire layer and the wafer is subjected to a sufficiently high temperature so that the palladium or platinum reacts with the silicon substrate to form a silicide region 34. The unreacted palladium or platinum is then chemically etched away. Then tantalum layer 35 is deposited over dielectric layer 31 and via 32. In addition to tantalum, other refractory metals which form an anodic oxide can be employed. Aluminum layer 33 is then deposited to a thickness of approximately 10,000 angstroms and a second tantalum thin layer 36 is deposited over the aluminum surface to a thickness of approximately 1,000 angstroms. The three depositions thus described can all be accomplished sequentially without a break in the vacuum chamber.

A second layer of silicon dioxide thin layer 38 is then deposited over the top of the tantalum. This deposition can be a sputter deposition, a plasma deposition or a chemical vapor deposition. A photoresist pattern is then formed over the second dielectric layer wherever the metal conductors are desired and the wafer subjected to an etch by a carbon tetrafluoride plasma with approximately 4% oxygen. The second silicon dioxide layer and the tantalum also could be wet chemically etched off the aluminum in areas not protected by the photoresist pattern. The exposed aluminum areas 37 are then anodized in a phosphoric or sulfuric solution to convert all of the exposed aluminum to aluminum oxide.

The anodization process will also anodize much of the tantalum layer 39 to form tantalum oxide, however, not all of the tantalum will be so converted and, thus, an additional anodization step is performed in a 3% aqueous solution of ammonium citrate with a forming voltage of approximately 200 volts. This process may then be followed by steam oxidation to approximately 450° C. to insure that all of the refractory metal under the porous aluminum oxide layer 37 is converted to an insulative oxide 39. The photoresist pattern is then removed and the wafer is ready for a subsequent deposition of a second dielectric layer and so forth.

The refractory metal layer over the aluminum conductor material serves to suppress hillock formation and thus performs the same function as the hard anodic layers employed in the prior art. The refractory metal under the aluminum conductor and over the palladium or platinum silicide layers inhibits the tendency of the aluminum from diffusing into the silicon substrate thereby changing the characteristics of the silicide Schottky diode.

Figure 4:
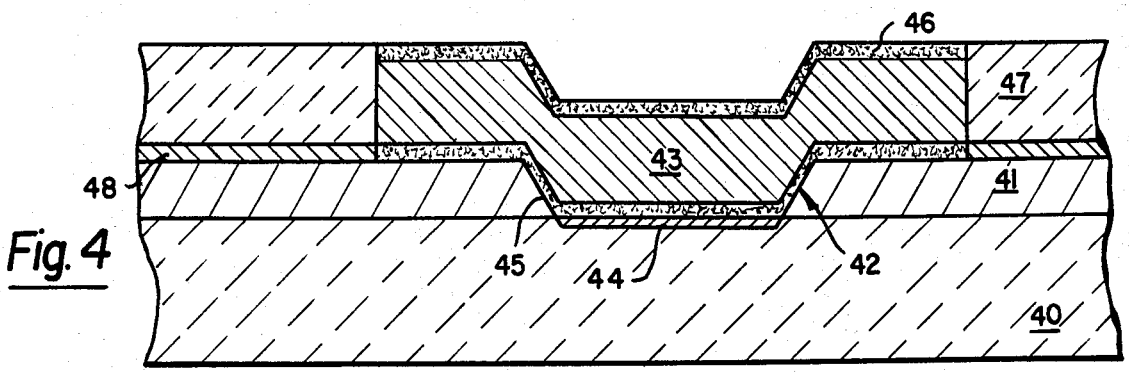

A third embodiment of the present invention is illustrated in FIG. 4. This embodiment is directed toward the application of the anodized refractory metal as a barrier between the silicide Schottky diode or contact and the aluminum metal on top thereof. In this embodiment via 42 is again opened in the silicon dioxide layer 41 on top of silicon substrate 40 and palladium or platinum is deposited over the entire structure. The wafer is then subjected to a sufficiently high temperature for the palladium or platinum to react to the silicon substrate to form silicide layer 44. The unreacted palladium or platinum is then wet chemically etched away. A tantalum (or other suitable refractory metal) thin layer 43 is then deposited over the dielectric layer and its via to a thickness of approximately 300 angstroms and aluminum layer 43 is then deposited thereover to a thickness of approximately 10,000 angstroms. Again, two depositions can be sequentially performed without a break in the vacuum chamber.

Aluminum layer 43 is then subjected to an anodization to form a thin porous oxide layer thereover so as to provide better adhesion for a later photoresist step. Aluminum layer 43 is then subjected to a hard anodization to form a hard anodic layer 46 on aluminum layer 43 to a thickness of approximately 1000 angstroms. The photoresist pattern is then formed on the surface where the metal conductors are to remain. The exposed hard anodic aluminum oxide layer is then wet chemically etched away to expose those portions of aluminum layer 43 to be subsequently anodized. Again, the exposed aluminum is anodized is a phosphoric or sulfuric solution to convert all the exposed aluminum to aluminum oxide. The underlying tantalum is converted to tantalum oxide as was described in relation to the embodiment in FIG. 3.

It will be appreciated that the above described interconnections can be employed with both MOS and Bipolar devices as well as with the amorphous semiconductors structures. Also, different aluminum alloys can be employed instead of aluminum.

EPOLOGUE

An interconnect structure for an integrated circuit has been described, which structure does not require a hard anodization to prevent the formation of hillocks. The structure employs a refractory metal layer over the interconnecting metal layer and can also employ such a refractory metal layer under the interconnecting layer. In addition, Schottky diodes can be formed in the silicon substrate under the interconnect structure which diodes are formed of palladium or platinum silicide.

While only a few embodiments of the present invention have been described, it will be apparent to one skilled in the art that variations and modifications may be made therein without departing from the spirit and the scope of the invention as claimed.

What is claimed is:

1. An improved planar multilevel electrical interconnect structure for employment with semiconductor devices which are integrated on the surface of a semiconductor substrate; said interconnect structure being of the type which includes a first insulating layer overlying said surface; a first plurality of spaced-apart aluminum connectors to said devices lying on said first insulating layer; a second insulating layer overlying said first plurality of spaced-apart aluminum connectors; a second plurality of connectors to said devices lying on said second insulating layer and crossing over said first plurality of spaced-apart aluminum connectors at various locations with said second insulating layer lying therebetween; wherein the improvement comprises:

a patterned anodized aluminum oxide layer between said first and second insulating layers filling the spaces between and forming a planar structure with said first plurality of spaced-apart aluminum connectors;

a refractory metal selected from the group of tantalum, titanium, tungsten, and hafnium overlying said first plurality of connectors at said locations where said first and second plurality of connectors cross over each other and abutting said patterned anodized aluminum oxide layer; and the sides of said refractory metal abutting said patterned anodized aluminum oxide layer being anodized and operating as an insoluble barrier to anodizing solutions and the remainder of said refractory metal being unanodized.

2. An interconnect structure according to claim 1, wherein said refractory metal is tantalum.

3. An interconnect structure according to claim 1, wherein said refractory metal is selected from the group of tungsten, titanium, and alloys of the two.

4. An interconnect structure according to claim 1, wherein said first insulating layer on said surface has a plurality of holes to said surface, and wherein at least a portion of said first plurality of connectors respectively extend through said holes to said surface.

5. An interconnect structure according to claim 4, wherein a region exists between said surface and said connectors in said holes which is formed of an aluminum-silicon alloy.

6. An interconnect structure according to claim 4, wherein a region exists between said surface and said connectors in said holes which is formed of a platinum silicide.

7. An interconnect structure according to claim 4, wherein a region exists between said surface and said connectors in said holes which is formed of a palladium silicide.

* * * * *